(12) United States Patent
Nomoto et al.

(10) Patent No.: US 11,316,101 B2
(45) Date of Patent: Apr. 26, 2022

(54) STACK AND MAGNETIC DEVICE

(71) Applicant: KIOXIA CORPORATION, Tokyo (JP)

(72) Inventors: Rina Nomoto, Bunkyo Tokyo (JP);
Takayuki Tsukagoshi, Kawasaki Kanagawa (JP); Yasushi Nakasaki, Yokohama Kanagawa (JP); Masaru Toko, Kawasaki Kanagawa (JP); Tadashi Kai, Yokohama Kanagawa (JP); Takamitsu Ishihara, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 65 days.

(21) Appl. No.: 16/810,656

(22) Filed: Mar. 5, 2020

(65) Prior Publication Data

US 2020/0403150 A1 Dec. 24, 2020

(30) Foreign Application Priority Data

Jun. 20, 2019 (JP) .............................. JP2019-114578

(51) Int. Cl.
*H01L 43/10* (2006.01)
*H01L 43/02* (2006.01)
*G11C 11/16* (2006.01)
*H01L 27/22* (2006.01)
*H01L 43/08* (2006.01)

(52) U.S. Cl.
CPC ............ *H01L 43/10* (2013.01); *G11C 11/161* (2013.01); *H01L 27/222* (2013.01); *H01L 43/02* (2013.01); *H01L 43/08* (2013.01)

(58) Field of Classification Search
CPC ......... H01L 43/10; H01L 43/02; H01L 43/08; H01L 27/222
See application file for complete search history.

(56) References Cited

U.S. PATENT DOCUMENTS

| 6,197,439 | B1 | 3/2001 | Parkin et al. |
| 6,713,196 | B1 * | 3/2004 | Kaitsu ................. G11B 5/7373 428/832.2 |
| 6,741,433 | B1 | 5/2004 | Nishioka |
| 6,929,957 | B2 | 8/2005 | Min et al. |
| 7,226,796 | B2 | 6/2007 | Pietambaram et al. |

(Continued)

FOREIGN PATENT DOCUMENTS

| JP | 5177938 B2 | 9/2004 |
| JP | 4177954 B2 | 8/2008 |

(Continued)

*Primary Examiner* — Marc Anthony Armand
(74) *Attorney, Agent, or Firm* — Holtz, Holtz & Volek PC

(57) ABSTRACT

A stack of the embodiment includes: a first magnetic substance; a second magnetic substance; and a first nonmagnetic substance which is disposed between the first magnetic substance and the second magnetic substance and contains at least one first metal element (M1) selected from the group consisting of ruthenium (Ru) and osmium (Os) and at least one second metal element (M2) selected from the group consisting of rhodium (Rh) and iridium (Ir). A magnetic device of the embodiment includes: a third magnetic substance; the stack; and a second nonmagnetic substance which is disposed between the third magnetic substance and the stack.

13 Claims, 4 Drawing Sheets

(56) References Cited

U.S. PATENT DOCUMENTS

| | | | |
|---|---|---|---|
| 8,216,703 | B2 | 7/2012 | Sun et al. |
| 8,329,478 | B2 | 12/2012 | Shi et al. |
| 9,184,374 | B2 | 11/2015 | Sawada et al. |
| 10,573,802 | B2 | 2/2020 | Kishi et al. |
| 2008/0225581 | A1 | 9/2008 | Yamane et al. |
| 2014/0077319 | A1 | 3/2014 | Noma et al. |
| 2019/0251427 | A1* | 8/2019 | Park ................. H01L 43/10 |
| 2020/0083285 | A1 | 3/2020 | Nagase et al. |
| 2020/0083432 | A1 | 3/2020 | Iwasaki et al. |
| 2020/0091227 | A1 | 3/2020 | Iwayama et al. |
| 2020/0321518 | A1* | 10/2020 | Shiokawa ............ H01L 43/02 |

FOREIGN PATENT DOCUMENTS

| | | | |
|---|---|---|---|
| JP | 2008227388 A | 9/2008 | |
| JP | 5380317 B2 | 10/2013 | |
| JP | 2014060297 A | 4/2014 | |

\* cited by examiner

STACK AND MAGNETIC DEVICE

CROSS REFERENCE TO RELATED APPLICATION

This application is based upon and claims the benefit of priority from Japanese Patent Application No. 2019-114578, filed on Jun. 20, 2019; the entire contents of which are incorporated herein by reference.

FIELD

Embodiments described herein relate generally to a stack and a magnetic device.

BACKGROUND

In a magnetic random access memory (MRAM) which attracts attention as a nonvolatile memory, write operation and read operation of information are performed by using a magnetic tunnel junction (MTJ) element. The MTJ element generally has a structure where three layers of a magnetic layer as a free layer, a barrier layer, and a magnetic layer as a reference layer are stacked, and the writing of information is performed by flipping a spin of the free layer while fixing a direction of a spin of the reference layer, and the reading of information is performed by using a tunnel magnetoresistance ratio.

In advancing development of the MRAM, it has been a problem to reduce a write error rate (WER). The simple WER decreases as a write current increases. However, it has been reported that the direction of the spin of the reference layer is likely to be flipped when the current becomes a certain amount or more to increase the WER again. The spin direction of the reference layer is required to be sufficiently and strongly kept to reduce the WER due to the spin flipping of the reference layer. Further, it is also required to suppress a leakage magnetic field to prevent interference to an adjacent cell and the free layer. It has been studied to use a synthetic antiferromagnet (SAF) using antiferromagnetic coupling as the reference layer satisfying the above requirements.

A structure where a nonmagnetic metal spacer layer is inserted between two ferromagnetic metal layers is known as the SAF, and nonmagnetic metals such as ruthenium (Ru), iridium (Ir), or rhodium (Rh) are used for the spacer layer. In the SAF, it is important to control spin-coupling between the ferromagnetic metal layers. This coupling is called interlayer exchange coupling, and it is known that a sign and a size of the coupling depend on a kind and a film thickness of the nonmagnetic metal. A system enabling antiferromagnetic interlayer exchange coupling is called the SAF. By using the SAF for the reference layer, the spin is difficult to be flipped due to the interlayer exchange coupling, further, the leakage magnetic field becomes small due to the antiferromagnetic structure, and the reduction of the WER is expected.

It is required to further reduce the WER to advance miniaturization of the MTJ element. Strength of the interlayer exchange coupling of the SAF is necessary to be increased to further reduce the WER. However, it has been recognized that there is a limit to increase the strength of the interlayer exchange coupling in a case of the nonmagnetic metal layer used as the spacer layer of the conventional SAF. Accordingly, the SAF where the strength of the interlayer exchange coupling is further increased has been demanded to further increase the difficulty in the spin flipping and further decrease the leakage magnetic field.

SUMMARY

A stack of an embodiment includes: a first magnetic substance; a second magnetic substance; and a first nonmagnetic substance which is disposed between the first magnetic substance and the second magnetic substance, and contains at least one first metal element (M1) selected from the group consisting of ruthenium (Ru) and osmium (Os) and at least one second metal element (M2) selected from the group consisting of rhodium (Rh) and iridium (Ir).

A magnetic device of the embodiment includes: a third magnetic substance; the stack of the embodiment; and a second nonmagnetic substance which is disposed between the third magnetic substance and the stack.

DETAILED DESCRIPTION

Hereinafter, a stack and a magnetic device according to embodiments are described with reference to the drawings. In each embodiment presented below, substantially the same components are denoted by the same reference signs, and a description thereof is sometimes partially omitted. The drawings are schematic, and a relationship between a thickness and a planar size, thickness proportions of the respective portions, and the like are sometimes different from actual ones.

Figure 1:
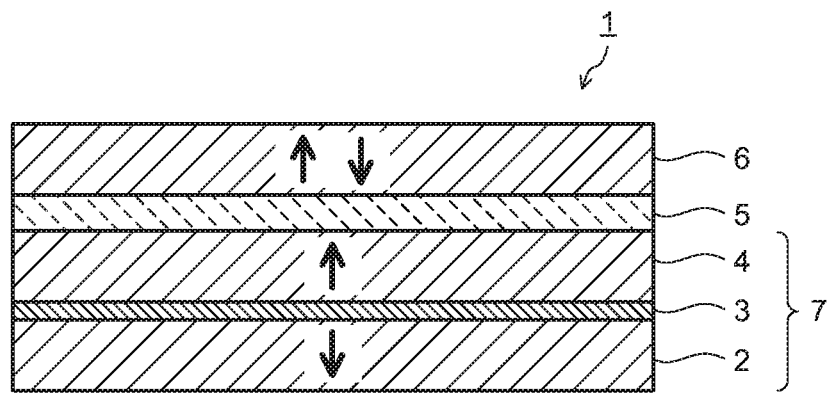
FIG. 1 is a sectional diagram illustrating a constitution of a magnetic device of an embodiment.
Figure 2:
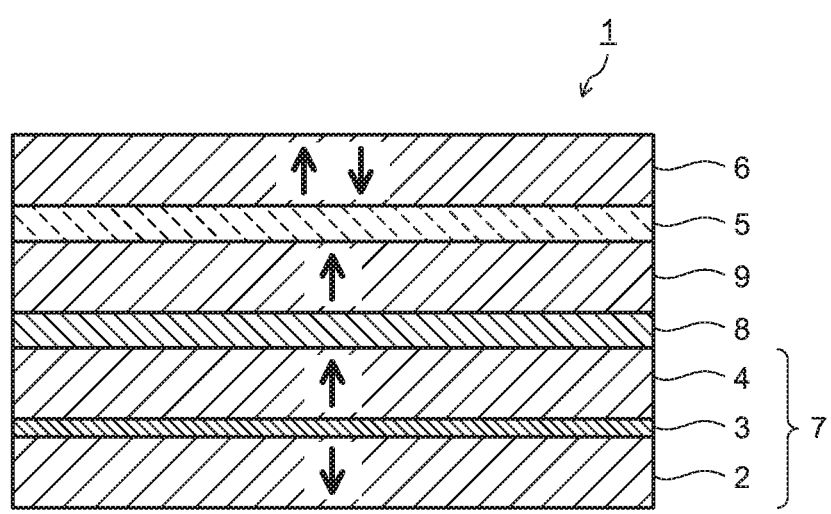
FIG. 2 is a sectional diagram illustrating a modification example of the magnetic device of the embodiment.

FIG. 1 is a diagram illustrating a constitution of a stack and a magnetic device of the embodiment. A magnetic device 1 illustrated in FIG. 1 includes a stack 7 including a first magnetic substance 2, a first nonmagnetic substance 3, and a second magnetic substance 4. A second nonmagnetic substance 5 and a third magnetic substance 6 are further stacked on the stack 7, and the magnetic device 1 has a multilayer structure where respective constituting layers are stacked in this order. The first magnetic substance 2, the first nonmagnetic substance 3, and the second magnetic substance 4 form a synthetic antiferromagnet. That is, the synthetic antiferromagnet as the stack 7 has the first nonmagnetic substance 3 disposed between the first magnetic substance 2 and the second magnetic substance 4. The magnetic device 1 may include a third nonmagnetic substance 8 and a fourth magnetic substance 9 disposed between the second magnetic substance 4 and the second nonmagnetic substance 5 as illustrated in FIG. 2. The magnetic devices 1 illustrated in FIG. 1 and FIG. 2 each form, for example, a magnetic tunnel junction (MTJ) element, but it is not limited thereto.

The stack (the synthetic antiferromagnet) 7 has a stacked film structure where the first magnetic substance 2, the first nonmagnetic substance 3, and the second magnetic substance 4 are stacked in this order as mentioned above. The first magnetic substance 2 and the first nonmagnetic substance 3, the first nonmagnetic substance 3 and the second magnetic substance 4 are respectively stacked under a state where they are directly in contact, and the synthetic antiferromagnet 7 is formed by the stacked film structure as stated above. Ferromagnetic substances such as, for example, cobalt (Co), iron (Fe), a cobalt-iron alloy (a CoFe alloy), a cobalt-iron-boron alloy (a CoFeB alloy), and a cobalt-platinum alloy (a CoPt alloy) can be used for the first and second magnetic substances 2, 4 in the synthetic antiferromagnet 7. A thickness of each of the first and second magnetic substances 2, 4 is not particularly limited, but it is preferably, for example, 0.2 nm or more and 5 nm or less.

The first nonmagnetic substance 3 in the synthetic antiferromagnet 7 is an antiferromagnetic coupling film (an antiparallel coupling film) which antiferromagnetically couples between the first magnetic substance 2 and the second magnetic substance 4 due to an indirect exchange interaction, and a nonmagnetic metal is generally used. In the synthetic antiferromagnet 7 of the embodiment, a nonmagnetic metal material containing at least one first metal element (M1) selected from the group consisting of ruthenium (Ru) and osmium (Os) and at least one second metal element (M2) selected from the group consisting of rhodium (Rh) and iridium (Ir) is applied to the first nonmagnetic substance 3. This nonmagnetic metal material is preferably an alloy of M1 and M2, more preferably a compound of M1 and M2, and the compound preferably has a composition represented by, for example, a composition formula: $M1_{1-x}M2_x$, where x is an atomic ratio, and the details will be described later. M1 and M2 in the nonmagnetic metal material are each preferably one kind of metal, but it is not excluded to contain two kinds of metals.

In the synthetic antiferromagnet 7, a spin direction D1 of the first magnetic substance 2 and the spin direction D2 of the second magnetic substance 4 become an antiparallel state because the first magnetic substance 2 and the second magnetic substance 4 are antiferromagnetically coupled with the first nonmagnetic substance 3 therebetween. FIG. 1 illustrates a state where the first and second magnetic substances 2, 4 are magnetized in a film surface vertical direction thereof, and thereby, the spin direction D1 of the first magnetic substance 2 and the spin direction D2 of the second magnetic substance 4 face reverse directions. The first nonmagnetic substance 3 preferably has a thickness of, for example, 0.3 nm or more and 2 nm or less to effectively exhibit a function as the antiferromagnetic coupling film as stated above. When the thickness of the first nonmagnetic substance 3 is over 2 nm, there is a possibility that antiferromagnetic coupling force between the first magnetic substance 2 and the second magnetic substance 4 is weakened. When the thickness of the first nonmagnetic substance 3 is less than 0.3 nm, uniform formability of the first nonmagnetic substance 3 is lowered. The first magnetic substance 2, the first nonmagnetic substance 3, and the second magnetic substance 4 can be each formed by using a film-forming technology such as a sputtering method, but the method is not limited to the sputtering method.

Conventionally, element metals (metal simple substances) such as ruthenium (Ru), osmium (Os), rhodium (Rh), or iridium (Ir) have been used as the first nonmagnetic substance 3 functioning as the above-stated antiferromagnetic coupling film, but there is a limit for the element metal layer in increasing the strength of the interlayer exchange coupling, and for example, when the magnetic device 1 is used as the MTJ element for the MRAM which is required to be miniaturized, it becomes difficult to reduce the write error rate (WER). The WER is likely to occur as a cell area of the MRAM is miniaturized. In the synthetic antiferromagnet 7 of the embodiment, the first nonmagnetic substance 3 made of the nonmagnetic metal material containing M1 and M2 is therefore applied.

Figure 3:
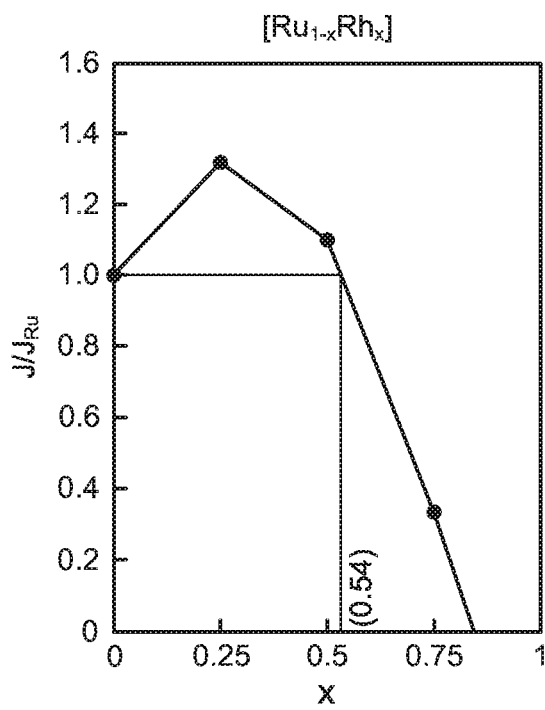
FIG. 3 is a diagram illustrating a relationship between a compound composition and strength of interlayer exchange coupling in a synthetic antiferromagnet using a nonmagnetic substance made of a compound of Ru and Rh of the embodiment.
Figure 4:
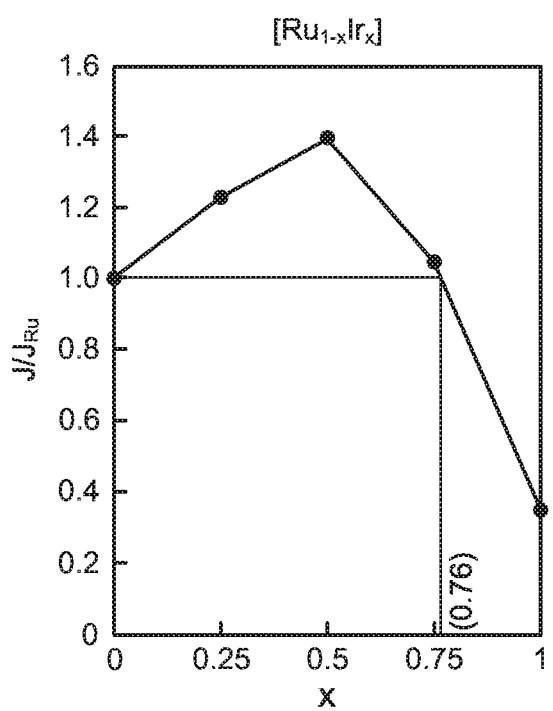
FIG. 4 is a diagram illustrating the relationship between the compound composition and the strength of the interlayer exchange coupling in the synthetic antiferromagnet using the nonmagnetic substance made of a compound of Ru and Ir of the embodiment.
Figure 5:
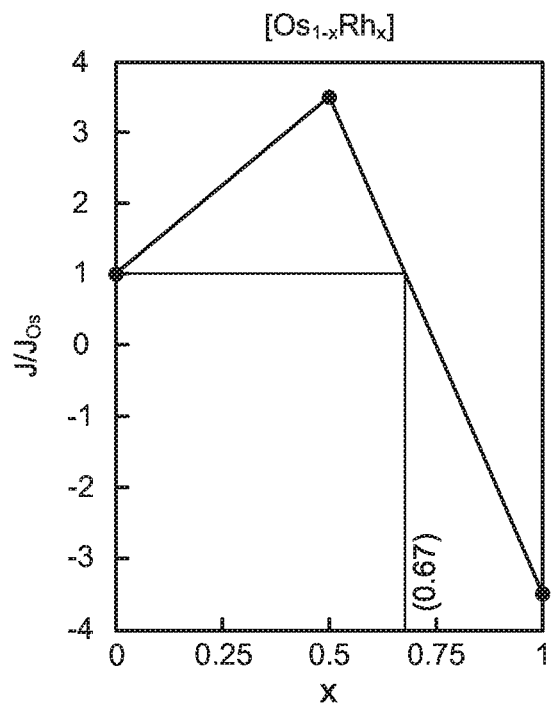
FIG. 5 is a diagram illustrating the relationship between the compound composition and the strength of the interlayer exchange coupling in the synthetic antiferromagnet using the nonmagnetic substance made of a compound of Os and Rh of the embodiment.
Figure 6:
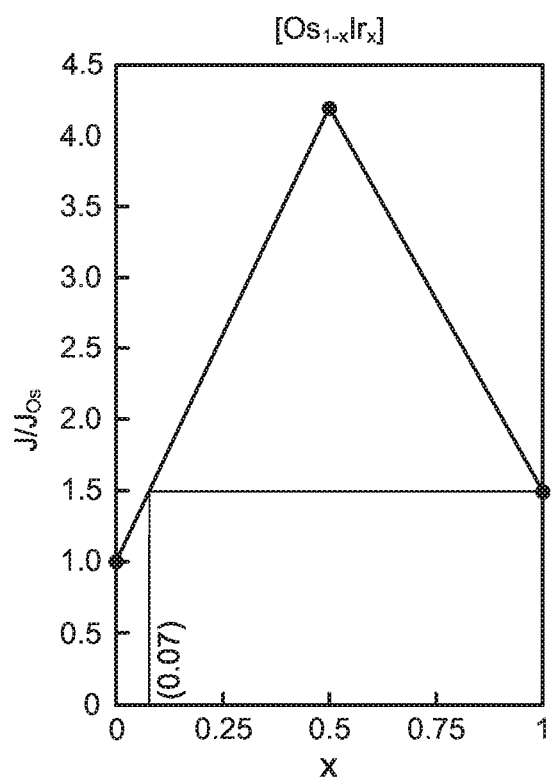
FIG. 6 is a diagram illustrating the relationship between the compound composition and the strength of the interlayer exchange coupling in the synthetic antiferromagnet using the nonmagnetic substance made of a compound of Os and Ir of the embodiment.

By applying the first nonmagnetic substance 3 made of the alloy, the compound, or the like of at least one first metal element (M1) selected from ruthenium (Ru) and osmium (Os) being a group 8 element and at least one second metal element (M2) selected from rhodium (Rh) and iridium (Ir) being a group 9 element, the interlayer exchange coupling between the first magnetic substance 2 and the second magnetic substance 4 can be increased compared to the case when the element metal layer (simple metal layer) of Ru, Os, Rh, or Ir is used. A relationship between a composition of a compound and strength of interlayer exchange coupling in the synthetic antiferromagnet 7 using the first nonmagnetic substance 3 of the embodiment is illustrated in each of FIG. 3 to FIG. 6. FIG. 3 illustrates the relationship between the composition and the strength of the interlayer exchange coupling when a compound of Ru and Rh is used. FIG. 4 illustrates the relationship between the composition and the strength of the interlayer exchange coupling when a compound of Ru and Ir is used. FIG. 5 illustrates the relationship between the composition and the strength of the interlayer exchange coupling when a compound of Os and Rh is used. FIG. 6 illustrates the relationship between the composition and the strength of the interlayer exchange coupling when a compound of Os and Ir is used.

In a relationship diagram between the composition of the compound and the strength of the interlayer exchange coupling illustrated in each of FIG. 3 to FIG. 6, the composition of the compound of a horizontal axis represents the atomic ratio x in the composition formula: $M1_{1-x}M2_x$. Concretely, FIG. 3 illustrates the atomic ratio x in the composition formula: $Ru_{1-x}Rh_x$. FIG. 4 illustrates the atomic ratio x in the composition formula: $Ru_{1-x}Ir_x$. FIG. 5 illustrates the atomic ratio x in the composition formula: $Os_{1-x}Rh_x$. FIG. 6 illustrates the atomic ratio x in the composition formula: $Os_{1-x}Ir_x$. A vertical axis in the relationship diagram illustrated in each of FIG. 3 to FIG. 6 represents a value simulating interlayer exchange coupling in a stack of a Co3 atomic layer (the first magnetic substance 2), one atomic layer of the compound (the first nonmagnetic substance 3), and a Co3 atomic layer (the second magnetic substance 4), and it is a relative value where the interlayer exchange coupling (J) using the compound is divided by each of the interlayer exchange couplings ($J_{Ru}$, $J_{Os}$) using the element metal (Ru in FIG. 3 and FIG. 4, and Os in FIG. 5 and FIG. 6).

As illustrated in FIG. 3, it can be seen that the strength ($J/J_{Ru}$) of the interlayer exchange coupling is improved by using the first nonmagnetic substance 3 made of a compound 1 having the composition represented by $Ru_{1-x}Rh_x$ compared to cases when a nonmagnetic substance made of an element substance of Ru (a case when x in $Ru_{1-x}Rh_x$ is "0" (zero)) and a nonmagnetic substance made of an element substance of Rh (a case when x in $Ru_{1-x}Rh_x$ is 1) are used. Since the interlayer exchange coupling when the nonmagnetic substance made of the element substance of Ru is used is larger than the interlayer exchange coupling when the nonmagnetic substance made of the element substance of Rh is used, the interlayer exchange coupling of the first nonmagnetic substance 3 made of the compound 1 becomes smaller than the interlayer exchange coupling when the nonmagnetic substance formed of the element substance of Ru is used depending on the value of the composition x in $Ru_{1-x}Rh_x$. As illustrated in FIG. 3, the strength ($J/J_{Ru}$) of the interlayer exchange coupling increases as the value of the composition x in $Ru_{1-x}Rh_x$ is increased, then decreases after a peak, and when the composition x in $Ru_{1-x}Rh_x$ is 0.54, the strength becomes an equivalent value as the strength ($J/J_{Ru}$) of the interlayer exchange coupling when the nonmagnetic substance made of the element substance of Ru is used. Accordingly, the composition x in $Ru_{1-x}Rh_x$ is preferably over "0" (zero) and less than 0.54 (0<x<0.54). The composition x in $Ru_{1-x}Rh_x$ is more preferably in a range of $0.05 \leq x \leq 0.45$, and further desirably in a range of $0.15 \leq x \leq 0.35$ to more increase the strength ($J/J_{Ru}$) of the interlayer exchange coupling.

As illustrated in FIG. 4, it can be seen that the strength ($J/J_{Ru}$) of the interlayer exchange coupling is improved also when the first nonmagnetic substance 3 made of a compound 2 having the composition represented by $Ru_{1-x}Ir_x$ is used compared to cases when the nonmagnetic substance made of the element substance of Ru (a case when x in $Ru_{1-x}Ir_x$ is "0" (zero)) and a nonmagnetic substance formed of an element substance of Ir (a case when x in $Ru_{1-x}Ir_x$ is 1) are used. Since the interlayer exchange coupling when the nonmagnetic substance made of the element substance of Ru is used is larger than the interlayer exchange coupling when the nonmagnetic substance made of the element substance of Ir is used, the interlayer exchange coupling of the first nonmagnetic substance 3 made of the compound 2 becomes smaller than the interlayer exchange coupling when the nonmagnetic substance made of the element substance of Ru is used depending on the value of the composition x in $Ru_{1-x}Ir_x$. As illustrated in FIG. 4, the strength ($J/J_{Ru}$) of the interlayer exchange coupling increases as the value of the composition x in $Ru_{1-x}Ir_x$ is increased, then decreases after a peak, and when the composition x in $Ru_{1-x}Ir_x$ is 0.76, the strength becomes an equivalent value as the strength ($J/J_{Ru}$) of the interlayer exchange coupling when the nonmagnetic substance made of the element substance of Ru is used. Accordingly, the composition x in $Ru_{1-x}Ir_x$ is preferably over "0" (zero) and less than 0.76 (0<x<0.76). The composition x in $Ru_{1-x}Ir_x$ is more preferably in a range of $0.3 \leq x \leq 0.7$, and further desirably in a range of $0.4 \leq x \leq 0.6$ to more increase the strength ($J/J_{Ru}$) of the interlayer exchange coupling.

As illustrated in FIG. 5, it can be seen that the strength ($J/J_{Os}$) of the interlayer exchange coupling is improved also when the first nonmagnetic substance 3 made of a compound 3 having the composition represented by $Os_{1-x}Rh_x$ is used compared to cases when a nonmagnetic substance made of an element substance of Os (a case when x in $Os_{1-x}Rh_x$ is "0" (zero)) and the nonmagnetic substance made of the element substance of Rh (a case when x in $Os_{1-x}Rh_x$ is 1) are used. Since the interlayer exchange coupling when the nonmagnetic substance made of the element substance of Os is used is larger than the interlayer exchange coupling when the nonmagnetic substance made of the element substance of Rh is used, the interlayer exchange coupling of the first nonmagnetic substance 3 made of the compound 3 becomes smaller than the interlayer exchange coupling when the nonmagnetic substance made of the element substance of Os is used depending on the value of the composition x in $Os_{1-x}Rh_x$. As illustrated in FIG. 5, the strength ($J/J_{Os}$) of the interlayer exchange coupling increases as the value of the composition x in $Os_{1-x}Rh_x$ is increased, then decreases after a peak, and when the composition x in $Os_{1-x}Rh_x$ is 0.67, the strength becomes an equivalent value as the strength ($J/J_{Os}$) of the interlayer exchange coupling when the nonmagnetic substance formed of the element substance of Rh is used. Accordingly, the composition x in $Os_{1-x}Rh_x$ is preferably over "0" (zero) and less than 0.67 (0<x<0.67). The composition x in $Os_{1-x}Rh_x$ is more preferably in a range of $0.2 \leq x \leq 0.6$, and further desirably in a range of $0.4 \leq x \leq 0.6$ to more increase the strength ($J/J_{Os}$) of the interlayer exchange coupling.

As illustrated in FIG. 6, it can be seen that the strength ($J/J_{Os}$) of the interlayer exchange coupling is improved also when the first nonmagnetic substance 3 made of a compound 4 having the composition represented by $Os_{1-x}Ir_x$ is used compared to cases when the nonmagnetic substance made of the element substance of Os (a case when x in $Os_{1-x}Ir_x$ is "0" (zero)) and the nonmagnetic substance formed of the element substance of Ir (a case when x in $Os_{1-x}Ir_x$ is 1) are used. Since the interlayer exchange coupling when the nonmagnetic substance made of the element substance of Ir is used is larger than the interlayer exchange coupling when the nonmagnetic substance made of the element substance of Os is used, the interlayer exchange coupling of the first nonmagnetic substance 3 made of the compound 4 becomes smaller than the interlayer exchange coupling when the nonmagnetic substance made of the element substance of Ir is used depending on the value of the composition x in $Os_{1-x}Ir_x$. As illustrated in FIG. 6, the strength ($J/J_{Os}$) of the interlayer exchange coupling increases as the value of the composition x in $Os_{1-x}Ir_x$ is increased, then decreases after a peak, and when the composition x in $Os_{1-x}Ir_x$ is 0.07, the strength becomes an equivalent value as the strength ($J/J_{Os}$) of the interlayer exchange coupling when the nonmagnetic substance made of the element substance of Ir is used. Accordingly, the composition x of $Os_{1-x}Ir_x$ is preferably over 0.07 and less than 1 (0.07<x<1). The composition x in $Os_{1-x}Ir_x$ is more preferably in a range of $0.3 \leq x \leq 0.7$, and further desirably in a range of $0.4 \leq x \leq 0.6$ to more increase the strength ($J/J_{Os}$) of the interlayer exchange coupling.

Figure 7:
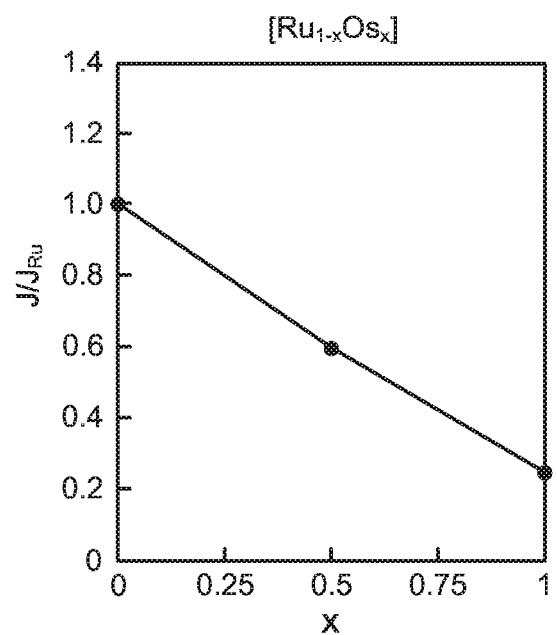
FIG. 7 is a diagram illustrating the relationship between the compound composition and the strength of the interlayer exchange coupling in the synthetic antiferromagnet using the nonmagnetic substance made of a compound of Ru and Os of a comparative example.
Figure 8:
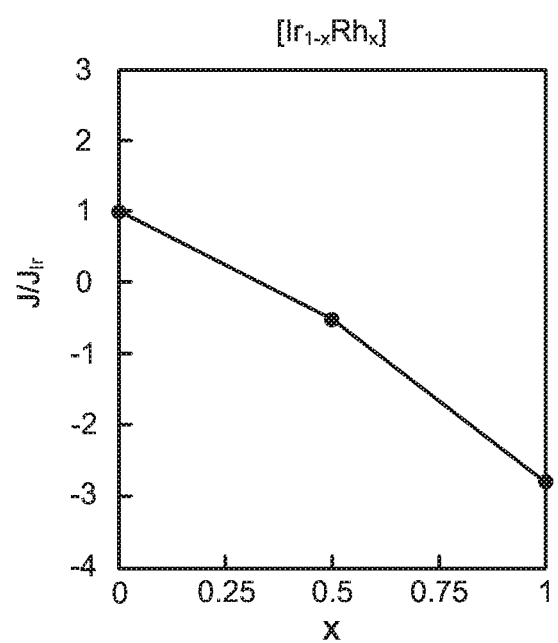
FIG. 8 is a diagram illustrating the relationship between the compound composition and the strength of the interlayer exchange coupling in the synthetic antiferromagnet using the nonmagnetic substance made of a compound of Rh and Ir of the comparative example.

As mentioned above, by applying the first nonmagnetic substance 3 made of the alloy, the compound, or the like of the first metal element (M1) being the group 8 element and the second metal element (M2) being the group 9 element, the interlayer exchange coupling between the first magnetic substance 2 and the second magnetic substance 4 can be increased. Here, an improvement effect of the strength of the interlayer exchange coupling enabled by making the substance into the alloy or the compound is only obtained based on a combination between the first metal element (M1)

being the group 8 element and the second metal element (M2) being the group 9 element, and the improvement effect of the strength of the interlayer exchange coupling cannot be obtained by a combination of the group 8 elements with each other and a combination of the group 9 elements with each other. FIG. 7 illustrates a relationship between the composition x in a compound ($Ru_{1-x}Os_x$) of Ru and Os and the strength of the interlayer exchange coupling. FIG. 8 illustrates a relationship between the composition x in a compound ($Ir_{1-x}Rh_x$) of Ir and Rh and the strength of the interlayer exchange coupling. In FIG. 7 and FIG. 8, a vertical axis is a relative value where the interlayer exchange coupling (J) using the compound is divided by each of the interlayer exchange couplings ($J_{Ru}$, $J_{Ir}$) using the element metal (Ru in FIG. 7, Ir in FIG. 8). As illustrated in FIG. 7 and FIG. 8, the interlayer exchange coupling changes monotonously in cases of the combination of the group 8 elements with each other and the combination of the group 9 elements with each other, and the strength cannot be increased compared to the interlayer exchange coupling using the element substance.

In the first nonmagnetic substance 3 formed of the alloy, the compound, or the like of the first metal element (M1) being the group 8 element and the second metal element (M2) being the group 9 element, the compositions of the alloys and the compounds using respective elements are as described above. Accordingly, when the composition ratio of the alloy, the compound, or the like of M1 and M2 is set as $M1_{1-x}M2_x$, the interlayer exchange coupling of $M1_{1-x}M2_x$ is set as $J_{M1M2}$, the interlayer exchange coupling of M1 alone is set as $J_{M1}$, and the interlayer exchange coupling of M2 alone is set as $J_{M2}$, where compositions when $J_{M1}>J_{M2}$ and $J_{M1M2}=J_{M1}$ are set as "0" (zero) and the composition x in $M1_{1-x}M2_x$ is preferably set in a range of $0<x\leq1$ where $J_{M1M2}>J_{M1}$. When compositions when $J_{M2}>J_{M1}$ and $J_{M1M2}=J_{M2}$ are set as x2 and 1, the composition x in $M1_{1-x}M2_x$ is preferably set in a range of $x2<x<1$ where $J_{M1M2}>J_{M2}$. The interlayer exchange coupling can be increased by applying $M1_{1-x}M2_x$ having the composition x as stated above to the first nonmagnetic substance 3.

As mentioned above, when the magnetic device 1 of the embodiment is applied to the MTJ element, properties of the MRAM can be improved even when the MRAM using the MTJ element is miniaturized because the interlayer exchange coupling of the synthetic antiferromagnet 7 functioning as the reference layer can be increased. That is, when the magnetic device 1 illustrated in FIG. 1 is used as the MTJ element, the synthetic antiferromagnet 7 functions as the reference layer (a magnetization fixed layer/a pinned layer) where a spin direction (a magnetization direction) is fixed. The second nonmagnetic substance 5 functioning as a tunnel barrier layer is provided on the synthetic antiferromagnet 7, and the third magnetic substance 6 functioning as a storage layer (a free layer) where the spin direction (the magnetization direction) changes in accordance with storage contents is provided thereon. As illustrated in FIG. 2, the third nonmagnetic substance 8 and the fourth magnetic substance 9 may be provided between the second magnetic substance 4 and the second nonmagnetic substance 5. The fourth magnetic substance 9 functions as the reference layer (the magnetization fixed layer/the pinned layer) where the magnetization direction is fixed by the synthetic antiferromagnet 7.

For example, magnesium oxide (MgO) is used for the second nonmagnetic substance 5 functioning as the tunnel barrier layer. Besides, insulators such as aluminum oxide (Al—O), titanium oxide (Ti—O), and aluminum nitride (Al—N) may be used for the second nonmagnetic substance 5. A thickness of the second nonmagnetic substance 5 is preferably, for example, 0.5 nm or more and 5 nm or less. When the thickness of the second nonmagnetic substance 5 is over 5 nm, there is a possibility that the function as the tunnel barrier layer is lowered. When the thickness is less than 0.5 nm, there is a possibility that it becomes difficult to uniformly form the second nonmagnetic substance 5. Nonmagnetic metals such as molybdenum (Mo), tantalum (Ta), tungsten (W), and vanadium (V) are used for the third nonmagnetic substance 8, and a thickness thereof is preferably, for example, 0.2 nm or more and 5 nm or less.

For example, ferromagnetic substances such as a cobalt-iron-boron alloy (a CoFeB alloy), a cobalt-iron alloy (a CoFe alloy), a cobalt-platinum alloy (a CoPt alloy) are used for the third magnetic substance 6 functioning as the storage layer (the free layer) and the fourth magnetic substance 9 functioning as the magnetization fixed layer (the pinned layer). Thicknesses of the third and fourth magnetic substances 6, 9 are not particularly limited, but for example, they are each preferably 0.2 nm or more and 5 nm or less. The third and fourth magnetic substances 6, 9 and the second and third nonmagnetic substances 5, 8 can be each formed by using the film-forming technology such as the sputtering method, but the method is not limited to the sputtering method.

In the magnetic device 1 as the MTJ element, writing of information can be performed by, for example, injecting the spin by applying the current to the third magnetic substance 6 as the storage layer, and flipping the magnetization direction of the third magnetic substance 6. Further, the writing can be also performed by using a current magnetic field generated by the current flowing through wirings provided in the vicinity thereof. Reading of information can be performed by using a tunnel magnetoresistance ratio which changes depending on a direction (in parallel or antiparallel to the reference layer (the magnetization fixed layer)) of the magnetization direction of the third magnetic substance 6. In the MTJ element 1 as stated above, the spin of the synthetic antiferromagnet 7 can be made to be further difficult to be flipped by increasing the interlayer exchange coupling of the synthetic antiferromagnet 7. That is, the magnetization direction of the synthetic antiferromagnet 7 as the reference layer can be further stabilized. Further, the leakage magnetic field can be made small, and interference to the adjacent cell and the free layer can be prevented by using the synthetic antiferromagnet 7 having the strong interlayer exchange coupling for the reference layer. It is thereby possible to reduce the write error rate (WER) even when, for example, the MTJ element 1 in the MRAM is miniaturized.

The stack 7 in the embodiment is not limited to the reference layer of the MTJ element 1 and can be used as the magnetization fixed layer or the like of various magnetic devices. The magnetic device 1 is not limited to the MTJ element and can be applied to various magnetoresistive effect elements. Further, the constitution of the magnetic device 1 is not limited to the above-stated components, and for example, a substrate, a base layer, a protection layer, and so on applied to a general magnetic device may be included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A stack, comprising:
   a first magnetic substance;
   a second magnetic substance; and
   a first nonmagnetic substance which is disposed between the first magnetic substance and the second magnetic substance, the first nonmagnetic substance containing at least one first metal element selected from the group consisting of ruthenium and osmium and at least one second metal element selected from the group consisting of rhodium and iridium,
   wherein the first nonmagnetic substance has:
   (i) a first composition represented by a composition formula $Ru_{1-x1}Rh_{x1}$, wherein x1 is an atomic ratio satisfying $0<x1<0.54$,
   (ii) a second composition represented by a composition formula $Ru_{1-x1}Ir_{x2}$, wherein x2 is an atomic ratio satisfying $0<x2<0.76$,
   (iii) a third composition represented by a composition formula $Os_{1-x3}Rh_{x3}$, wherein x3 is an atomic ratio satisfying $0<x3<0.67$, or
   (iv) a fourth composition represented by a composition formula $Os_{1-x4}Ir_{x4}$, wherein x4 is an atomic ratio satisfying $0.07<x4<1$.

2. A magnetic device, comprising:
   a stack comprising:
     a first magnetic substance;
     a second magnetic substance; and
     a first nonmagnetic substance which is disposed between the first magnetic substance and the second magnetic substance, the first nonmagnetic substance containing at least one first metal element selected from the group consisting of ruthenium and osmium and at least one second metal element selected from the group consisting of rhodium and iridium;
   a third magnetic substance; and
   a second nonmagnetic substance which is disposed between the stack and the third magnetic substance;
   wherein the first nonmagnetic substance has:
   (i) a first composition represented by a composition formula $Ru_{1-x1}Rh_{x1}$, wherein x1 is an atomic ratio satisfying $0<x1<0.54$,
   (ii) a second composition represented by a composition formula $Ru_{1-x2}Ir_{x2}$, wherein x2 is an atomic ratio satisfying $0<x2<0.76$,
   (iii) a third composition represented by a composition formula $Os_{1-x3}Rh_{x3}$, wherein x3 is an atomic ratio satisfying $0<x3<0.67$, or
   (iv) a fourth composition represented by a composition formula $Os_{1-x4}Ir_{x4}$, wherein x4 is an atomic ratio satisfying $0.07<x4<1$.

3. The device according to claim 2, further comprising:
   a third nonmagnetic substance and a fourth magnetic substance which are disposed between the second nonmagnetic substance and the stack.

4. The stack according to claim 1, wherein x1 in the first composition is an atomic ratio satisfying $0.05 \leq x1 \leq 0.45$.

5. The stack according to claim 1, wherein x2 in the second composition is an atomic ratio satisfying $0.3 \leq x2 \leq 0.7$.

6. The stack according to claim 1, wherein x3 in the third composition is an atomic ratio satisfying $0.2 \leq x3 \leq 0.6$.

7. The stack according to claim 1, wherein x4 in the fourth composition is an atomic ratio satisfying $0.3 \leq x4 \leq 0.7$.

8. The stack according to claim 1, wherein each of the first magnetic substance and the second magnetic substance has a thickness of 0.2 nm or more and 5 nm or less, and the first nonmagnetic substance has a thickness of 0.3 nm or more and 2 nm or less.

9. The device according to claim 2, wherein x1 in the first composition is an atomic ratio satisfying $0.05 \leq x1 \leq 0.45$.

10. The device according to claim 2, wherein x2 in the second composition is an atomic ratio satisfying $0.3 \leq x2 \leq 0.7$.

11. The device according to claim 2, wherein x3 in the third composition is an atomic ratio satisfying $0.2 \leq x3 \leq 0.6$.

12. The device according to claim 2, wherein x4 in the fourth composition is an atomic ratio satisfying $0.3 \leq x4 \leq 0.7$.

13. The device according to claim 2, wherein each of the first magnetic substance and the second magnetic substance has a thickness of 0.2 nm or more and 5 nm or less, and the first nonmagnetic substance has a thickness of 0.3 nm or more and 2 nm or less.

* * * * *